United States Patent [19]
Kajihara

[11] Patent Number: 5,616,957
[45] Date of Patent: Apr. 1, 1997

[54] PLASTIC PACKAGE TYPE SEMICONDUCTOR DEVICE

[75] Inventor: Mamoru Kajihara, Tokyo, Japan

[73] Assignee: NEC Corporation, Japan

[21] Appl. No.: 424,795

[22] Filed: Apr. 19, 1995

[30] Foreign Application Priority Data

May 19, 1994 [JP] Japan .................................. 6-128094

[51] Int. Cl.⁶ .................................................. H01L 23/34
[52] U.S. Cl. ........................... 257/712; 257/713; 257/787; 257/796
[58] Field of Search ..................... 257/796, 787, 257/712, 713

[56] References Cited

U.S. PATENT DOCUMENTS 5,225,710  7/1993  Westerkamp .............................. 257/796

FOREIGN PATENT DOCUMENTS 166051    7/1986  Japan ..................................... 257/796
63-044749 2/1988  Japan ..................................... 257/796
4158556   6/1992  Japan ..................................... 257/796

Primary Examiner—Sara W. Crane
Assistant Examiner—Roy Potter
Attorney, Agent, or Firm—Hayes, Soloway, Hennessey, Grossman & Hage, P.C.

[57] ABSTRACT

A semiconductor chip 1 is fixedly adhered to an island 2 of a lead frame with a die bonding material 4. The electrode pad positioned at an upper surface of the semiconductor chip 1 and a lead 3 of the lead frame are interconnected with a bonding wire 5. To the semiconductor chip 1, a heat spreader 6 is adhered with an insulating adhesive agent 7. The semiconductor chip 1, the island 2, an inner lead portion 3a of lead 3, the bonding wire 5 and the heat spreader 6 are sealed with sealing resin 8. Since, after completion of the die bonding and wire bonding processes, the heat spreader 6 is adhered to the chip 1, a high temperature die bonding and a high temperature wire bonding become possible without taking the thermal characteristics of the adhesive agent into account.

34 Claims, 5 Drawing Sheets

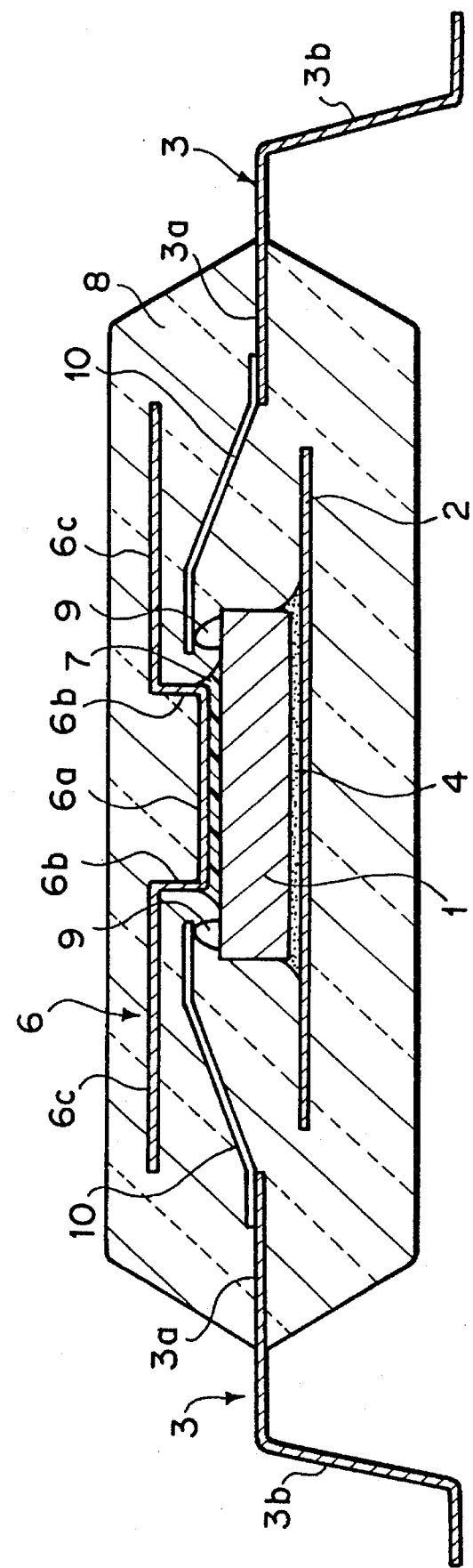

PLASTIC PACKAGE TYPE SEMICONDUCTOR DEVICE

FIELD OF THE INVENTION

The present invention relates to a plastic package type semiconductor device and, in particular, to a packaging technique for reducing heat resistance of the plastic package type semiconductor device.

BACKGROUND OF THE INVENTION

In a recent semiconductor device, since circuit elements in a semiconductor chip are arranged with a high density and with a high level of functions, the amount of heat evolved at per unit volume of the chip tends to increase. This is also the case in the plastic package type semiconductor device which is relatively inexpensive. Therefore, a low thermal resistance package structure has been adopted in the plastic package type semiconductor device.

As typical types of the low thermal resistance package structure, a heat radiating type and a heat spreader type have been known. In these types, the semiconductor chip loaded on a heat radiation plate is molded with resin, the heat radiating type being one in which the heat radiation plate is exposed to the outside of the surface of the mold resin, the heat spreader type being one in which the heat radiation plate is sealed within the mold resin. Among their, the latter is recommended for the semiconductor device having an integrated circuit chip because of its high moisture-proof reliability.

FIG. 1 is a cross-sectional view illustrating a structure of a conventional heat spreader type semiconductor device. As illustrated therein, a heat spreader 11 made of copper (Cu) is adhered to a lead 3 of a lead frame (hereinafter, the lead frame is referred to as LF) by means of an insulation tape 12 made of polyimide or the like. A semiconductor chip 1 is fixedly adhered to the heat spreader 11 by means of a die bonding material 4 made of silver (Ag) paste or the like. An electrode pad formed on the semiconductor chip 1 and the LF lead 3 are interconnected with a bonding wire 5. The entirety with the exeption of a part of the LF lead 3 is sealed with a sealing resin made of epoxy resin or the like.

This conventional semiconductor device is assembled as follows. A lead frame to which the heat spreader 11 is adhered with the insulation tape 12 is prepared, then Ag paste is applied on the heat spreader 11, and then the semiconductor chip 1 is loaded on the heat spreader 11 with the Ag paste being interposed. The Ag paste is cured by heat treatment at a temperature on the order of about 230 degrees Centigrade to fixedly adhere the semiconductor chip 1 to the heat spreader 11. Subsequently, the electrode pad of the semiconductor chip 1 and the LF lead 3 are interconnected by means of the bonding wire 5 made of gold (Au) according to a thermo-sonic bonding process (TS process). At this time, the lead frame and the semiconductor chip 1 are heated to the order of 230 degrees Centigrade. Next, resin sealing is conducted by utilizing a transfer molding process. Finally, the lead frame is plated, cut and formed to obtain a finished article.

In the foregoing heat spreader type semiconductor device, since it is assembled in such a manner that the heat spreader is previously adhered to the lead frame, the adhesive agent (insulation tape) is exposed to a considerable high temperature in both the die bonding and wire bonding processes, which results in the thermal hysteresis of the adhesive agent causing its deterioration.

On the other hand, the semiconductor chip has been more and more refined and integrated through refinement of the recent design rules while at the same time the area of the electrode pad is also being reduced. However, since the lead frame is not reduced in size enough to a degree corresponding to the refined degree of the semi-conductor chip, the distance between the semiconductor chip and a bonding point of the lead frame is made longer and a long wire bonding becomes necessary. In order to carry out the long wire bonding with excellent positional accuracy, supersonic energy must be made low, and, if the area of the electrode pad on the chip is reduced as described above, it becomes also necessary to miniaturize the Au ball for wire bonding.

Under such circumstances, in order to secure the adhesion strength of the bonding wire, it becomes necessary to maintain the semiconductor chip and the lead frame at a higher temperature (for example, 300 degrees Centigrade) when the wire bonding is carried out. Further, a stronger and less resistant connection of the chip to the island (in the conventional case as shown in FIG. 1, heat spreader) has also been called for as to the die bonding of the semiconductor chip. In order to meet this requirement, it is desirable to use Ag glass paste, but if such is is used, then a heat treatment at high temperature (for example, 350 degrees Centigrade) becomes necessary.

However, in the conventional heat spreader type semiconductor device, since deterioration of the adhesive agent (insulation tape) is of concern, such a high temperature heat treatment cannot be applied, and it is difficult to realize a highly adhesive and less resistant interconnection.

Further, in the conventional heat spreader-type semiconductor device, since it is impossible to practice TAB (tape automated bonding) system, which calls for a higher-temperature (up to 500 degrees Centigrade), the heat spreader type could not be applied to the semiconductor device using a TAB lead.

SUMMARY OF THE INVENTION

The present invention was made in view of the foregoing circumstances of the prior art, and an object of the present invention is to provide a heat spreader type semiconductor device which allows the high temperature bonding technique so that a plastic package type semiconductor device excellent in heat radiation performance, high in die bonding strength and wire bonding strength and low in connection resistance at the die bonding and wire bonding portions.

In order to achieve the foregoing object, according to the present invention, there is provided a plastic package type semiconductor device in which an electrode formed on an upper surface of a semiconductor chip at a first area and an inner lead portion of a lead frame are interconnected by means of a conductor, a heat spreader is adhered to the upper surface of the semiconductor chip at a second area which differs from the first area, and the semiconductor chip, the inner lead portion, the conductor and the heat spreader are sealed with resin.

In one embodiment of the present invention, the heat spreader comprises a bottom portion adhered to the upper surface of the semiconductor chip, a lateral wall portion a lower edge of which is connected to an outer edge of the bottom portion, and a top portion an inner edge of which is connected to an upper edge of the lateral wall portion. Herein, the electrode may be positioned at a peripheral area on the upper surface of the semiconductor chip, and a lower surface of the bottom portion of the heat spreader is adhered to the upper surface of the semiconductor chip at a central area. Herein, one or a plurality of openings may be provided through the top portion and/or lateral wall portion of the heat spreader.

In another embodiment of the present invention, one or a plurality of openings are provided through the heat spreader.

In the other embodiment of the present invention, the electrode is in the form of a pad or bump.

In the other embodiment of the present invention, the conductor comprises a bonding wire or a TAB lead.

In the other embodiment of the present invention, a lower surface of the semiconductor chip is fixed on an island of the lead frame.

In the other embodiment of the present invention, the heat spreader is adhered to the upper surface of the semiconductor chip by means of an insulating adhesive agent.

Since the heat spreader type semiconductor device according to the present invention is manufactured by using the ordinary island integrated lead frame, in die bonding and wire bonding, it becomes possible to adopt a high temperature bonding technique independently of the heat characteristics of the adhesive agent for the heat spreader. Therefore, according to the present invention, the semiconductor chip can be stably mounted with low resistance while even if a long wire bonding becomes necessary the wire bonding can be carried out in an excellent condition with high accuracy. Further, since the heat spreader (e.g. metallic plate) is embedded within the package, warp of the package is reduced, and coplanarity is improved.

The low thermal resistance effect of the package structure generally depends on the size of the heat spreader. In the present invention, since a heat spreader as large as the conventional one can be used, the thermal resistance can be reduced by 30% as compared with that of the conventional plastic package structure so as to obtain the same level of low thermal resistance effect as the conventional heat spreader system.

BRIEF DESCRIPTION OF THE DRAWINGS

FIG. 6 is a cross-sectional view of a second embodiment of the present invention.

DESCRIPTION OF THE PREFERRED EMBODIMENTS

Some embodiments of the present invention are hereinafter described with reference to the accompanying drawings.

Figure 1:
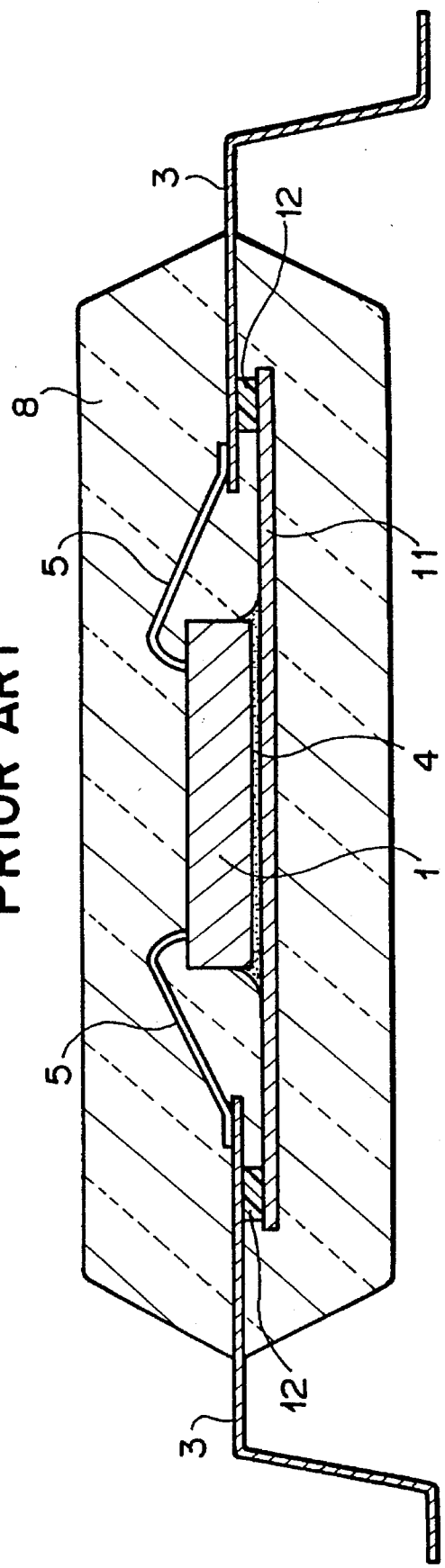
FIG. 1 is a cross-sectional view of a conventional heat spreader type semiconductor device.
Figure 2:
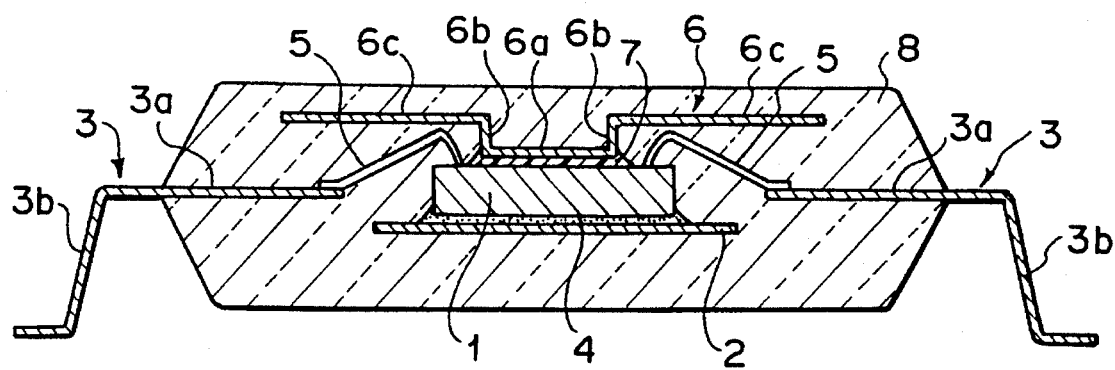
FIG. 2 is a cross-sectional view of a first embodiment of the present invention.

FIG. 2 is a cross-sectional view illustrating a first embodiment of the present invention. As shown therein, a semiconductor chip 1 is fixedly adhered to an island 2 of a lead frame by means of a die bonding material 4, and an electrode pad formed on the semiconductor chip 1 and an LF lead 3 are interconnected by means of a bonding wire 5. To the semiconductor chip 1, a heat spreader 6 is adhered by means of an insulating adhesive agent 7. They are entirely sealed with resin 8 with the exception of a part of the LF lead 3.

The LF lead 3 comprises an inner lead portion 3a sealed with the resin 8 and an outer lead portion 3b protruding out of the resin 8. The heat spreader 6 comprises a bottom portion 6a adhered to the upper surface of the semiconductor chip 1, a lateral wall portion 6b a lower edge of which is connected to the outer edge of the bottom portion 6a, and a top portion 6c an inner edge of which is connected to the upper edge of the lateral wall portion 6b.

Figure 3:
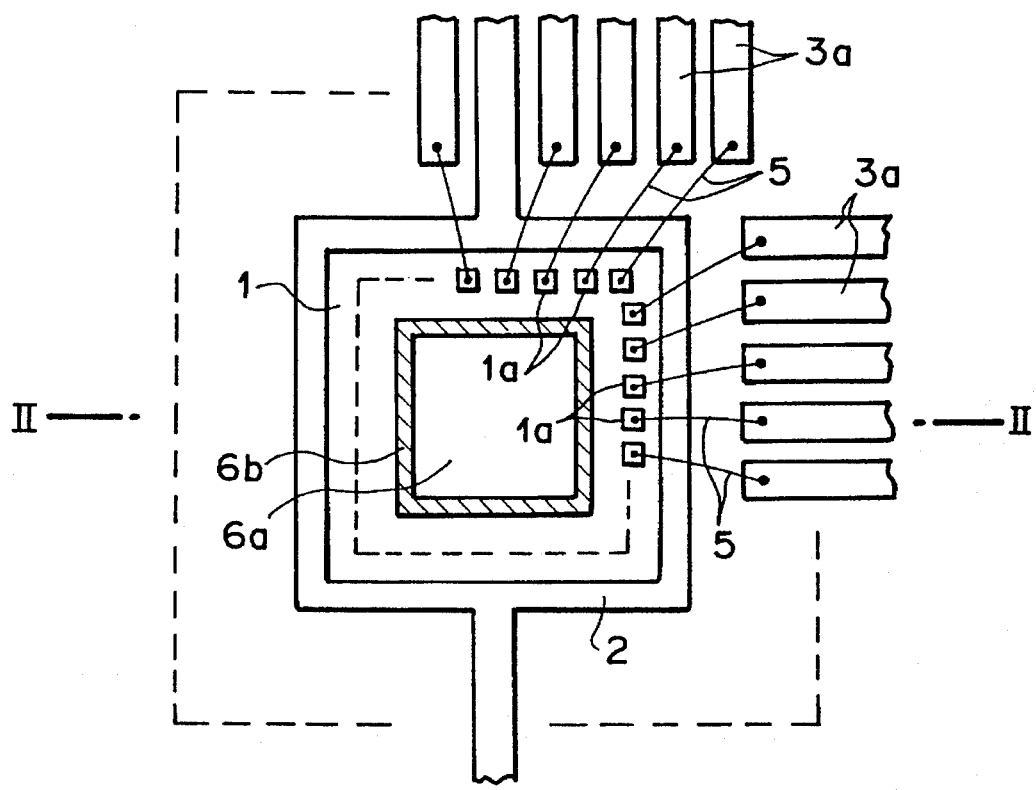
FIG. 3 is a partial, transversal, cross-sectional view of FIG. 2 where a sealing resin is omitted.

FIG. 3 is a partial, transversal, cross-sectional view of FIG. 2 where the sealing resin 8 is omitted. FIG. 2 shows a cross-sectional view along line II—II of FIG. 3. As shown in FIG. 3, the electrode pad 1a is positioned at a peripheral area of the upper surface of the semiconductor chip 1, and the electrode pad 1a and the inner end of the corresponding inner lead portion 3a are interconnected by the bonding wire 5.

The bottom portion 6a of the heat spreader 6 is adhered to the upper surface of the semiconductor chip 1 at a central area. In the semiconductor chip 1, almost all circuit elements which evolve the heat are positioned at the central area of the upper surface side. The above-mentioned electrode pad 1a is an input/output terminal to or from the chip circuit having the heat evolving elements.

Since the heat spreader 6 is adhered to the upper surface of the semiconductor chip 1 at the central area of the upper surface side, where almost all heat evolving circuit elements are formed, heat can be radiated through the heat spreader 6 effectively. Further, since the heat spreader 6 is buried in the sealing resin 8, warp of the plastic package can be effectively prevented.

Figure 4A:
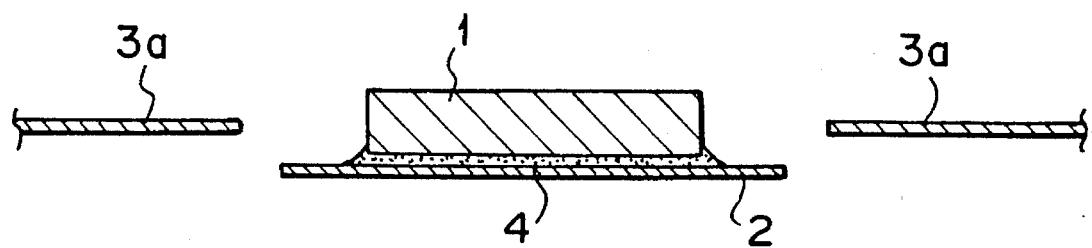
FIGS. 4A to 4C are partial, cross-sectional views showing an assembling process of the first embodiment of the present invention.
Figure 4B:
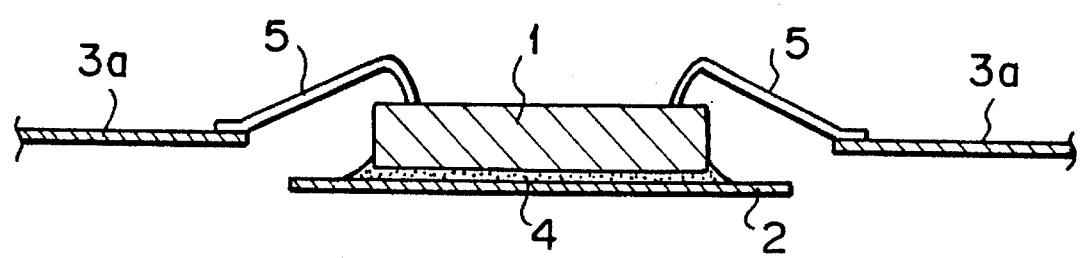
Figure 4C:
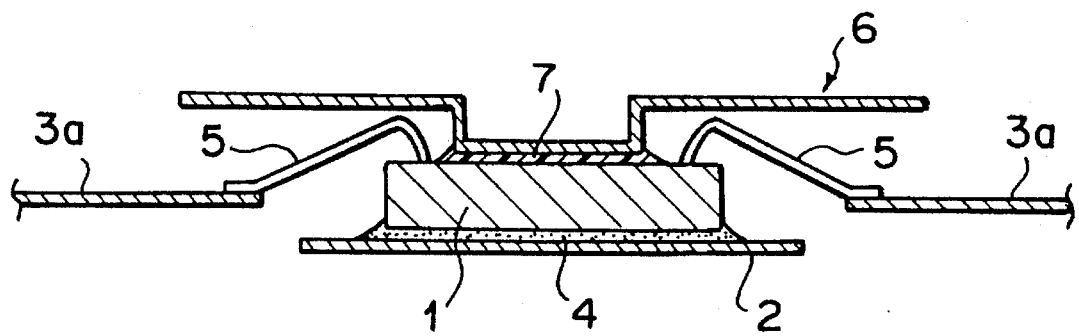

Next, an example of a method of manufacturing a semiconductor device of the above embodiment according to the present invention is described. FIGS. 4A to 4C are partial, cross-sectional views showing an assembling process of the above first embodiment of the present invention.

First, as shown in FIG. 4A, the die bonding material 4 made of Ag glass paste was applied on the island 2 of the lead frame which was made of copper (Cu), the semiconductor chip 1 was loaded on the island 2 with the die bonding material 4 being interposed, a heat treatment was conducted at the temperature of 400 degrees Centigrade to fixedly adhere the semiconductor chip 1 to the island 2.

Then, as shown in FIG. 4B, according to the thermo-sonic bonding, the electrode pad of the semiconductor chip 1 and the LF inner lead portion 3a were interconnected with the bonding wire 5 made of gold (Au) wire at the heating temperature of 280 degrees Centigrade.

Then, as shown in FIG. 4C, the insulating adhesive agent 7 made of a thermosetting silicon resin was applied on the upper surface of the chip 1 at the central area and, after the heat spreader 6 made of copper (Cu) was placed, the adhesive agent 7 was cured at the temperature of 200 degrees Centigrade.

Thereafter, packaging or resin sealing was carried out at the temperature of 180 degrees Centigrade according to the transfer molding process, and further, the outer lead portion of the lead frame was plated, cut and formed to obtain a finished article shown in FIGS. 2 and 3.

As described above, in the assembling process of the semiconductor device of the present invention, since after adhesion of the heat spreader 6 no high temperature thermal treatment is carried out, that is heat hysteresis of the adhesive agent for the heat spreader 6 is relatively low and short, thus the adhesive agent is not deteriorated. Further, since the die bonding process and the wire bonding process are set prior to the adhesion process of the heat spreader 6, it becomes possible to practice the die bonding and wire bonding at a sufficiently high temperature, so that the bondings of sufficient strength and the interconnection of low resistance become possible to thereby improve the reliability of the semiconductor device.

Figure 5A:
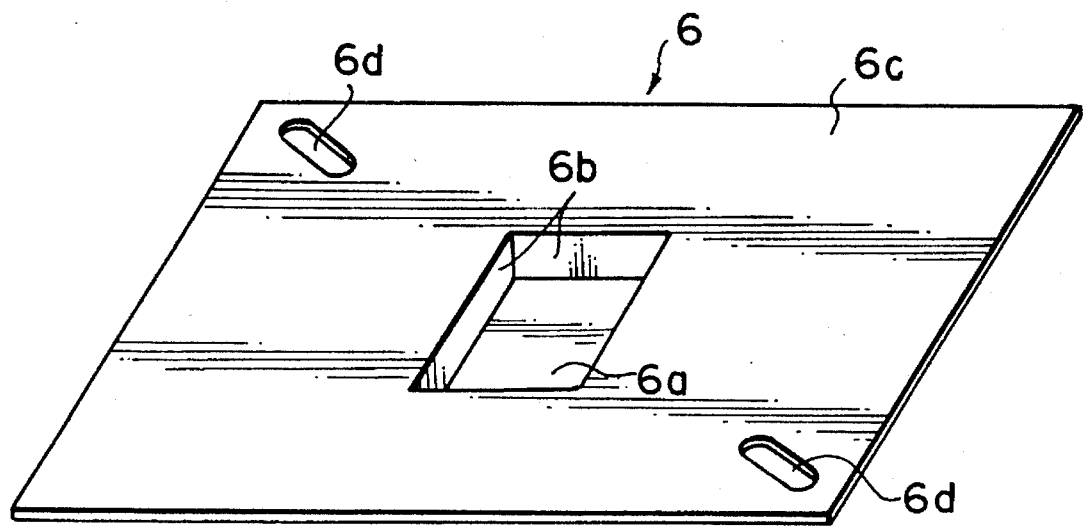
FIGS. 5A and 5B are perspective views of a heat spreader.
Figure 5B:
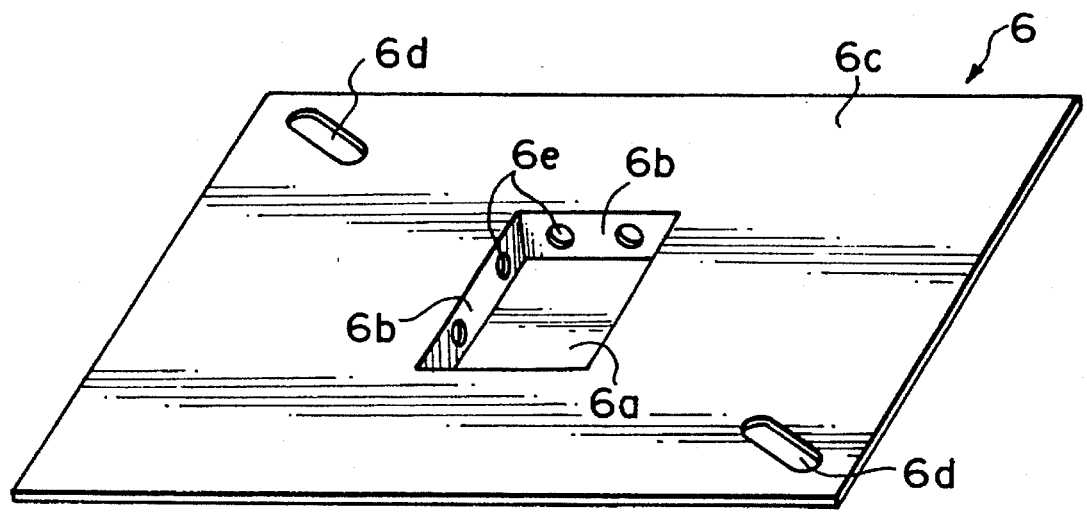

FIGS. 5A and 5B are perspective views of the heat spreader 6. As illustrated therein, the heat spreader 6 has a recessed portion at the central portion to form the above-mentioned bottom portion 6a, lateral wall portion 6b and the top portion 6c, so that contact between the top portion 6c and the bonding wire 5 can be avoided by adhering the lower surface of the bottom portion 6a on the upper surface of the semiconductor chip 1 at the central area.

A plurality of openings 6d are formed through the top portion 6c of the heat spreader 6 shown in FIG. 5A to ensure flow of resin during transfer molding process, while a plurality of openings 6d and a plurality of openings 6e are formed respectively through the top portion 6c and the lateral wall portion 6b of the heat spreader 6 shown in FIG. 5B to ensure flow of resin during transfer molding process. The shape, position and number of these openings 6d, 6e are determined appropriately depending on the shape of the mold for resin sealing and the position and shape of injection hole of the mold and the like. Since provision of these openings ensures sealability based on the flow of resin during the transfer molding process even if the heat spreader is made larger, a larger metallic plate can be used as the heat spreader 6 without any disadvantage, and a high heat radiating performance can be achieved. Further, these openings 6d, 6e, after being sealed, consolidate coupling between the heat spreader 6 and the sealing resin 8 the by the anchoring effect where one part of the sealing resin 8 at the upper side of the heat spreader 6 is connected to the other part of the resin at the lower side of the heat spreader 6 through the openings.

FIG. 6 is a cross-sectional view of a second embodiment of the present invention. This embodiment is suitably applicable to a case in which a low thermal resistance package is necessary in a TAB-QFP (TAB-quad flat package) type semiconductor device using a TAB lead for the inner lead bonding of QFP (quad flat package) structure. Since, in FIG. 6, like reference numerals are each assigned to the portions each corresponding to those of the first embodiment shown in FIGS. 2 and 3, any repeated description is omitted.

In this embodiment, an electrode bump 9 is formed on the semiconductor chip 1 at the same position as the electrode pad 1a of the first embodiment shown in FIGS. 2 and 3, and the electrode bump 9 and the inner lead portion 3a of the LF lead 3 are interconnected by means of a TAB lead 10.

In TAB-QFP, when the TAB lead is bonded to the LF lead (i.e. outer lead bonding of the TAB lead), a high temperature thermal treatment (about 500 degrees Centigrade) is necessary. Therefore, in the conventional heat spreader type in which the heat spreader is previously adhered to the lead frame with the adhesive agent, TAB system could not be adopted.

However, according to the present invention, if after the outer lead bonding, i.e. after the bonding between the semiconductor chip 1 and LF lead 3, the heat spreader 6 is adhered to the semiconductor chip 1, then, even in the TAB-QFP structure semiconductor device, it becomes possible to adopt a means for making the thermal resistance lower according to the heat spreader system.

Although a several preferred embodiments were described, the present invention is not necessarily restricted to the foregoing embodiments, but various changes and modifications could be made without departing from the essence of the present invention. For example, although in the foregoing embodiments a gull-wing type package was described, the present invention is also applicable to other package types of semiconductor devices including an SOJ (small outline J-leaded package) type semiconductor device. Further, as the sealing resin, a highly heat conductive one may be used. An example of the sealing resin having high heat conductivity is a resin which includes particles of high heat conductivity such as crystalline silica or aluminum nitride as a filler.

What is claimed is:

1. A plastic package type semiconductor device in which an electrode formed on an upper surface of a semiconductor chip at a first area and an inner lead portion of a lead frame are inter-connected by means of a conductor, and comprising a heat spreader which is adhered to the upper surface of said semiconductor chip at a second area which differs from said first area, said heat spreader comprising a bottom portion adhered to the upper surface of said semiconductor chip, a lateral wall portion a lower edge of which is connected to an outer edge of said bottom portion, and a top portion an inner edge of which is connected to an upper edge of said lateral wall portions, and having at least one opening provided therethrough, and wherein said semiconductor chip, said inner lead portion, said conductor and said heat spreader are sealed with resin, said electrode is positioned at a peripheral area on the upper surface of said semiconductor chip, and a lower surface of said bottom portion of the heat spreader is adhered to the upper surface of said semiconductor chip at a central area, and said at least one opening is provided said lateral wall portion of the heat spreader.

2. A plastic package type semiconductor device as set forth in claim 1, wherein at least one additional opening is provided through said top portion of the heat spreader.

3. A plastic package type semiconductor device as set forth in claim 1, wherein said electrode comprises a pad.

4. A plastic package type semiconductor device as set forth in claim 1, wherein said electrode comprises a bump.

5. A plastic package type semiconductor device as set forth in claim 1, wherein said conductor comprises a bonding wire.

6. A plastic package type semiconductor device as set forth in claim 1, wherein said conductor comprises a TAB lead.

7. A plastic package type semiconductor device as set forth in claim 1, wherein a lower surface of said semiconductor chip is fixed on an island of said lead frame.

8. A plastic package type semiconductor device as set forth in claim 1, wherein said heat spreader is adhered to the upper surface of said semiconductor chip by means of an insulating adhesive agent.

9. A plastic package type semiconductor device according to claim 1, wherein said heat spreader has a recessed portion formed in the central portion of the top portion.

10. A plastic package type semiconductor device in which an electrode comprising a bump formed on an upper surface of a semiconductor chip at a first area and an inner lead portion of a lead frame are interconnected by means of a conductor, and comprising a heat spreader which is adhered to the upper surface of said semiconductor chip at a second area which differs from said first area, said heat spreader comprising a bottom portion adhered to the upper surface of said semiconductor chip, a lateral wall portion a lower edge of which is connected to an outer edge of said bottom portion, and a top portion an inner edge of which is connected to an upper edge of said lateral wall portion, and having an opening provided therethrough, and wherein said semiconductor chip, said inner lead portion, said conductor and said heat spreader are sealed with resin.

11. A plastic package type semiconductor device as set forth in claim 10, wherein said electrode is positioned at a peripheral area on the upper surface of said semiconductor chip, and a lower surface of said bottom portion of the heat spreader is adhered to the upper surface of said semiconductor chip at a central area.

12. A plastic package type semiconductor device as set forth in claim 11, wherein said opening is provided through said top portion of the heat spreader.

13. A plastic package type semiconductor device as set forth in claim 11, wherein said opening is provided through said lateral wall portion or the heat spreader.

14. A plastic package type semiconductor device as set forth in claim 10, wherein said conductor comprises a bonding wire.

15. A plastic package type semiconductor device as set forth in claim 10, wherein said conductor comprises a TAB lead.

16. A plastic package type semiconductor device as set forth in claim 10, wherein a lower surface of said semiconductor chip is fixed on an island of said lead frame.

17. A plastic package type semiconductor device as set forth in claim 10, wherein said heat spreader is adhered to the upper surface of said semiconductor chip by means of an insulating adhesive agent.

18. A plastic package type semiconductor device as set forth in claim 10, wherein said heat spreader has a recessed portion formed in the central portion of the top portion.

19. A plastic package type semiconductor device in which an electrode formed on an upper surface of a semiconductor chip at a first area and an inner lead portion of a lead frame are interconnected by means of a conductor comprising a TAB lead, and comprising a heat spreader which is adhered to the upper surface of said semiconductor chip at a second area which differs from said first area, said heat spreader comprising a bottom portion adhered to the upper surface of said semiconductor chip, a lateral wall portion a lower edge of which is connected to an outer edge of said bottom portion, and a top portion an inner edge of which is connected to an upper edge of said lateral wall portion, and having an opening provided therethrough, and wherein said semiconductor chip, said inner lead portion, said conductor and said heat spreader are sealed with resin.

20. A plastic package type semiconductor device as set forth in claim 19, wherein said electrode is positioned at a peripheral area on the upper surface of said semiconductor chip, and a lower surface of said bottom portion of the heat spreader is adhered to the upper surface of said semiconductor chip at a central area.

21. A plastic package type semiconductor device as set forth in claim 20, wherein said opening is provided through said top portion of the heat spreader.

22. A plastic package type semiconductor device as set forth in claim 20, wherein said opening is provided through said lateral wall portion of the heat spreader.

23. A plastic package type semiconductor device as set forth in claim 19, wherein said electrode comprises a pad.

24. A plastic package type semiconductor device as set forth in claim 19, wherein a lower surface of said semiconductor chip is fixed on an island of said lead frame.

25. A plastic package type semiconductor device as set forth in claim 19, wherein said heat spreader is adhered to the upper surface of said semiconductor chip by means of an insulating adhesive agent.

26. A plastic package type semiconductor device as set forth in claim 19, wherein said heat spreader has a recessed portion formed in the central portion of the top portion.

27. A plastic package type semiconductor device in which an electrode formed on an upper surface of a semiconductor chip at a first area and an inner lead portion of a lead frame are interconnected by means of a conductor, and comprising a heat spreader which is adhered to the upper surface of said semiconductor chip at a second area which differs from said first area, said heat spreader comprising a bottom portion adhered to the upper surface of said semiconductor chip, a lateral wall portion a lower edge of which is connected to an outer edge of said bottom portion, and a top portion an inner edge of which is connected to an upper edge of said lateral wall portion, and having a plurality of openings provided therethrough, and wherein said semiconductor chip, said inner lead portion, said conductor and said heat spreader are sealed with resin, said electrode is positioned at a peripheral area on the upper surface of said semiconductor chip, and a lower surface of said bottom portion of the heat spreader is adhered to the upper surface of said semiconductor chip at a central area, said top portion having a rectangular configuration, said openings being provided through said top portion at both a first corner position and a second corner position, said second corner position being diagonal to said first corner position; and wherein an additional opening is provided through said lateral wall portion of the heat spreader.

28. A plastic package type semiconductor device as set forth in claim 27, wherein said electrode comprises a pad.

29. A plastic package type semiconductor device as set forth in claim 27, wherein said electrode comprises a bump.

30. A plastic package type semiconductor device as set forth in claim 27, wherein said conductor comprises a bonding wire.

31. A plastic package type semiconductor device as set forth in claim 27, wherein said conductor comprises a TAB lead.

32. A plastic package type semiconductor device as set forth in claim 27, wherein a lower surface of said semiconductor chip is fixed on an island of said lead frame.

33. A plastic package type semiconductor device as set forth in claim 27, wherein said heat spreader is adhered to the upper surface of said semiconductor chip by means of an insulating adhesive agent.

34. A plastic package type semiconductor device as set forth in claim 27 wherein said heat spreader has a recessed portion formed in the central portion of the top portion.

* * * * *

UNITED STATES PATENT AND TRADEMARK OFFICE
CERTIFICATE OF CORRECTION

PATENT NO. : 5,616,957
DATED : April 1, 1997
INVENTOR(S) : Mamoru Kajihara

It is certified that error appears in the above-indentified patent and that said Letters Patent is hereby corrected as shown below:

Claim 1, Column 6, Line 36, insert --through-- after "provided".

Claim 13, Column 7, Line 20, "or" should be --of--.

Signed and Sealed this

Twenty-fourth Day of June, 1997

Attest:

BRUCE LEHMAN

Attesting Officer     Commissioner of Patents and Trademarks